(12) United States Patent
Kim et al.

(10) Patent No.: US 8,537,296 B2
(45) Date of Patent: Sep. 17, 2013

(54) DISPLAY DEVICE WHEREIN A THICKNESS OF A FIRST INSULATING LAYER IS GREATER THAN A THICKNESS OF A FIRST CONDUCTOR AND WHEREIN THE FIRST INSULATING LAYER COMPLETELY COVERS LATERAL SIDE SURFACES OF THE FIRST CONDUCTOR

(75) Inventors: Jong-In Kim, Yongin-si (KR); Jang-Soo Kim, Yongin-si (KR); Young-Wook Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 918 days.

(21) Appl. No.: 12/268,725

(22) Filed: Nov. 11, 2008

(65) Prior Publication Data

US 2009/0309099 A1    Dec. 17, 2009

(30) Foreign Application Priority Data

Jun. 11, 2008    (KR) .......................... 10-2008-0054544

(51) Int. Cl.
*G02F 1/136* (2006.01)
*G02F 1/1333* (2006.01)

(52) U.S. Cl.
USPC .......................................... 349/43; 349/138

(58) Field of Classification Search
USPC ................................... 349/42–46, 138
See application file for complete search history.

(56) References Cited

U.S. PATENT DOCUMENTS

| | | | |
|---|---|---|---|
| 5,756,371 A | | 5/1998 | Ohno |
| 5,919,532 A | * | 7/1999 | Sato et al. ................. 428/1.6 |
| 7,223,641 B2 | | 5/2007 | Maekawa |
| 2004/0046905 A1 | * | 3/2004 | Hong et al. ................. 349/43 |
| 2005/0122442 A1 | * | 6/2005 | Park .............................. 349/43 |
| 2006/0145155 A1 | * | 7/2006 | Choi et al. ................... 257/59 |
| 2006/0290867 A1 | * | 12/2006 | Ahn et al. .................... 349/141 |
| 2007/0085112 A1 | | 4/2007 | Yamazaki |
| 2007/0096096 A1 | | 5/2007 | Kuwabara |
| 2007/0134907 A1 | * | 6/2007 | Ikeda et al. ................. 438/618 |

FOREIGN PATENT DOCUMENTS

| | | |
|---|---|---|
| JP | 06051350 | 2/1994 |
| JP | 06326130 | 11/1994 |
| JP | 07333648 | 12/1995 |
| JP | 08023102 | 1/1996 |
| JP | 2006308922 | 11/2006 |
| JP | 2007171314 | 7/2007 |
| KR | 1020030073006 | 9/2003 |
| KR | 1020050064661 | 6/2005 |
| KR | 100628256 | 9/2006 |
| KR | 1020060121268 | 11/2006 |

* cited by examiner

*Primary Examiner* — Paul Lee
(74) *Attorney, Agent, or Firm* — H.C. Parks & Associates, PLC

(57) ABSTRACT

The present invention relates to a display device and a manufacturing method thereof. The display device includes a substrate, a first conductor disposed on the substrate, a first insulating layer disposed on the first conductor, a second insulating layer disposed on the first insulating layer, a semiconductor disposed on the second insulating layer, and a second conductor disposed on the semiconductor. A thickness of the first insulating layer is greater than a thickness of the first conductor, and the first insulating layer includes a first opening exposing the first conductor.

13 Claims, 22 Drawing Sheets

DISPLAY DEVICE WHEREIN A THICKNESS OF A FIRST INSULATING LAYER IS GREATER THAN A THICKNESS OF A FIRST CONDUCTOR AND WHEREIN THE FIRST INSULATING LAYER COMPLETELY COVERS LATERAL SIDE SURFACES OF THE FIRST CONDUCTOR

CROSS-REFERENCE TO RELATED APPLICATION

This application claims priority from and the benefit of Korean Patent Application No. 10-2008-0054544, filed on Jun. 11, 2008, which is hereby incorporated by reference for all purposes as if fully set forth herein.

BACKGROUND OF THE INVENTION

1. Field of the Invention

The present invention relates to a display device and a manufacturing method thereof.

2. Discussion of the Background

Recently, flat panel display devices have exploded onto the market, and sales thereof are growing quickly. A flat panel display is a display device with a small thickness relative to the size of the screen, and a liquid crystal display (LCD) and an organic light emitting device (OLED) are widely used flat panel displays.

A liquid crystal display is one type of flat panel display that is now widely used. The liquid crystal display includes two display panels in which field generating electrodes such as pixel electrodes and a common electrode are formed, and a liquid crystal layer disposed between the two display panels. In the liquid crystal display, voltages are applied to the field generating electrodes to generate an electric field in the liquid crystal layer, which determines the direction of liquid crystal molecules of the liquid crystal layer to regulate polarization of incident light, thereby displaying an image.

A liquid crystal display having a structure in which field generating electrodes are respectively formed on two display panels is widely used. Particularly, a general structure of the widely used liquid crystal display includes one display panel having a plurality of pixel electrodes disposed in a matrix form and another display panel having a common electrode covering the whole surface thereof. In the liquid crystal display, each pixel electrode is separately supplied with a voltage to display an image. A thin film transistor (TFT) is a three terminal element that is connected to each pixel electrode to switch a voltage to be applied to the pixel electrode. A plurality of gate lines to transmit signals to control the thin film transistors and a plurality of data lines to transmit data voltages that are applied to the pixel electrodes are provided on a display panel. The thin film transistor functions as a switching element to transmit a data voltage to a pixel electrode in response to a gate signal from a gate line.

As display devices such as liquid crystal displays increase in size and resolution, a signal delay such as an RC delay may be generated such that each pixel may not be sufficiently charged with a data voltage, which may deteriorate the display's characteristics.

SUMMARY OF THE INVENTION

The present invention provides a display device that may have improved display characteristics.

The present invention also provides a method of manufacturing the display device.

Additional features of the invention will be set forth in the description which follows, and in part will be apparent from the description, or may be learned by practice of the invention.

The present invention discloses a display device including a substrate, a first conductor disposed on the substrate, a first insulating layer disposed on the first conductor, a second insulating layer disposed on the first insulating layer, a semiconductor disposed on the second insulating layer, and a second conductor disposed on the semiconductor. A thickness of the first insulating layer is greater than a thickness of the first conductor, and the first insulating layer includes a first opening exposing the first conductor.

The present invention also discloses a method of manufacturing a display device including forming a first conductor on a substrate, forming a first insulating layer on the first conductor, forming a first opening, which exposes the first conductor, in the first insulating layer, forming a second insulating layer on the first insulating layer, forming a semiconductor on the second insulating layer, forming a second conductor, which includes a source electrode and a drain electrode, on the semiconductor, forming a passivation layer on the second conductor, and forming a pixel electrode on the passivation layer. A thickness of the first insulating layer is greater than a thickness of the first conductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
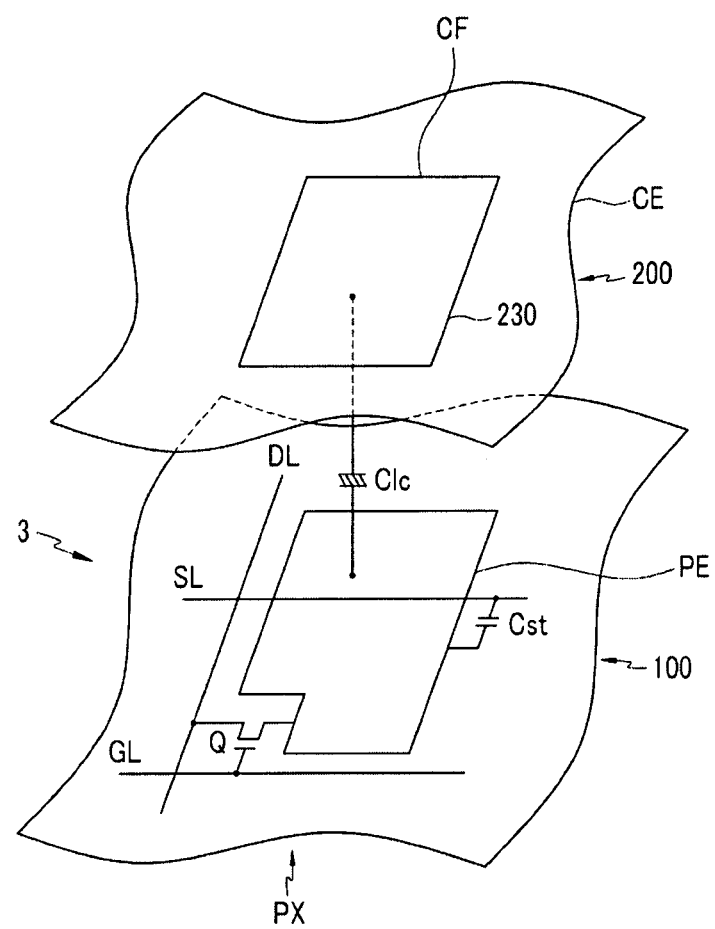
FIG. 1 is an equivalent circuit diagram of one pixel in a liquid crystal panel assembly according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Now, a liquid crystal display according to an exemplary embodiment of the present invention will be described with reference to FIG. 1.

FIG. 1 is an equivalent circuit diagram of one pixel in a liquid crystal display according to an exemplary embodiment of the present invention.

Referring to FIG. 1, a liquid crystal panel assembly according to an exemplary embodiment of the present invention includes a lower panel 100 and an upper panel 200 facing each other, and a liquid crystal layer 3 disposed therebetween.

The lower panel 100 is provided with signal lines including a gate line GL, a data line DL, and a storage electrode line SL, a switching transistor Q connected to the gate line GL and the data line DL, and a pixel electrode PE connected thereto.

The gate line GL transmits a gate signal, the data line DL transmits a data signal, and the storage electrode line SL is supplied with a voltage such as a common voltage Vcom. The data line DL crosses the gate line GL and the storage electrode line SL.

The switching element Q is a three terminal element such as a thin film transistor. The thin film transistor has a control terminal connected to the gate line GL, an input terminal connected to the data line DL, and an output terminal connected to the pixel electrode PE.

The upper panel 200 includes a common electrode CE and a color filter CF.

The common electrode CE is formed on the whole surface of the upper panel 200 and is supplied with the common voltage Vcom.

For color display, each pixel PX may uniquely represent a primary color (i.e., spatial division) or each pixel PX may sequentially represent the primary colors in turn (i.e., temporal division), such that a spatial or temporal sum of the primary colors is recognized as a desired color. An example of a set of the primary colors includes red, green, and blue. FIG. 1 shows an example of the spatial division in which each pixel PX includes a color filter CF representing one of the primary colors in an area of the upper panel 200 facing the pixel electrode PE. Alternatively, unlike FIG. 1, the color filter CF may be provided on or under the pixel electrode PE on the lower panel 100.

The liquid crystal layer 3 may have negative dielectric anisotropy. The liquid crystal molecules of the liquid crystal layer 3 may be arranged so that longitudinal axes of the liquid crystal molecules are perpendicular to the surfaces of the two panels 100 and 200 in the absence of an electric field. Unlike FIG. 1, the common electrode CE may be formed on the lower panel 100, and in this case, at least one of the two electrodes PE and CE may have a linear shape or a bar shape.

The pixel electrode PE of the lower panel 100 and the common electrode CE of the upper panel 200 form a liquid crystal capacitor Clc with the liquid crystal layer 3 acting as a dielectric material.

Also, a storage capacitor Cst, which serves as an auxiliary capacitor to the liquid crystal capacitor Clc, is formed where the pixel electrode PE and the storage electrode line SL overlap each other with an insulator interposed therebetween. However, the storage capacitor Cst may instead be formed where the pixel electrode PE overlaps a previous gate line GL via an insulator.

At least one polarizer (not shown) is provided in the liquid crystal panel assembly.

In the liquid crystal display including such a liquid crystal panel assembly, the pixel electrode PE receives a data voltage through the data line DL, and the common electrode CE is supplied with the common voltage Vcom. A difference between the data voltage that is applied to the pixel PX and the common voltage Vcom is represented as a charge voltage of the liquid crystal capacitor Clc, i.e., a pixel voltage. The orientations of the liquid crystal molecules change according to the magnitude of the pixel voltage, so that the polarization of light passing through the liquid crystal layer 3 changes. The change in the polarization appears as a change in transmittance of light by the polarizer, whereby the liquid crystal display displays images.

Now, the liquid crystal panel assembly according to an exemplary embodiment of the present invention will be described in detail with reference to FIG. 2, FIG. 3, and FIG. 4.

Figure 2:
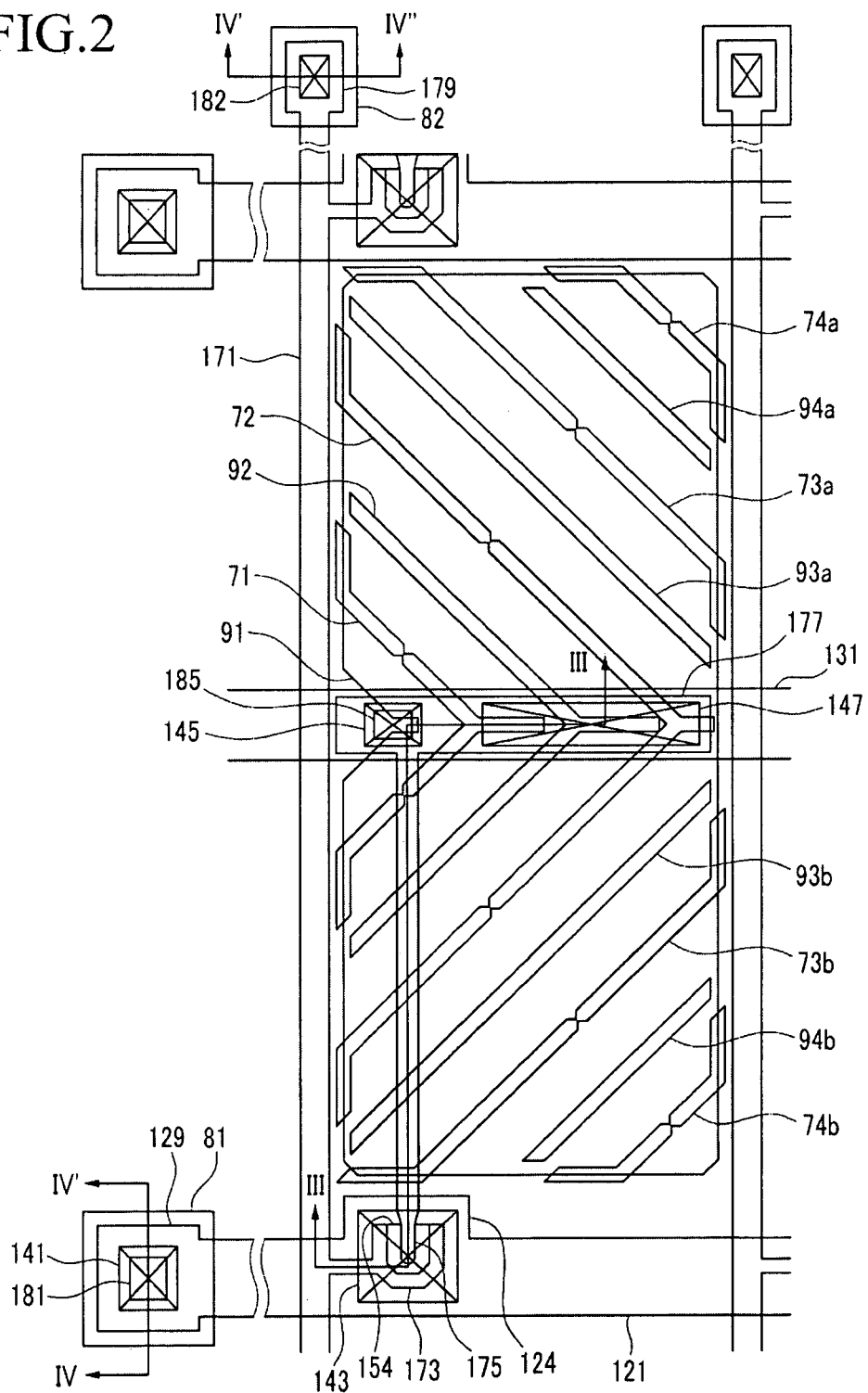
FIG. 2 is a layout view of a liquid crystal panel assembly according to an exemplary embodiment of the present invention.
Figure 3:
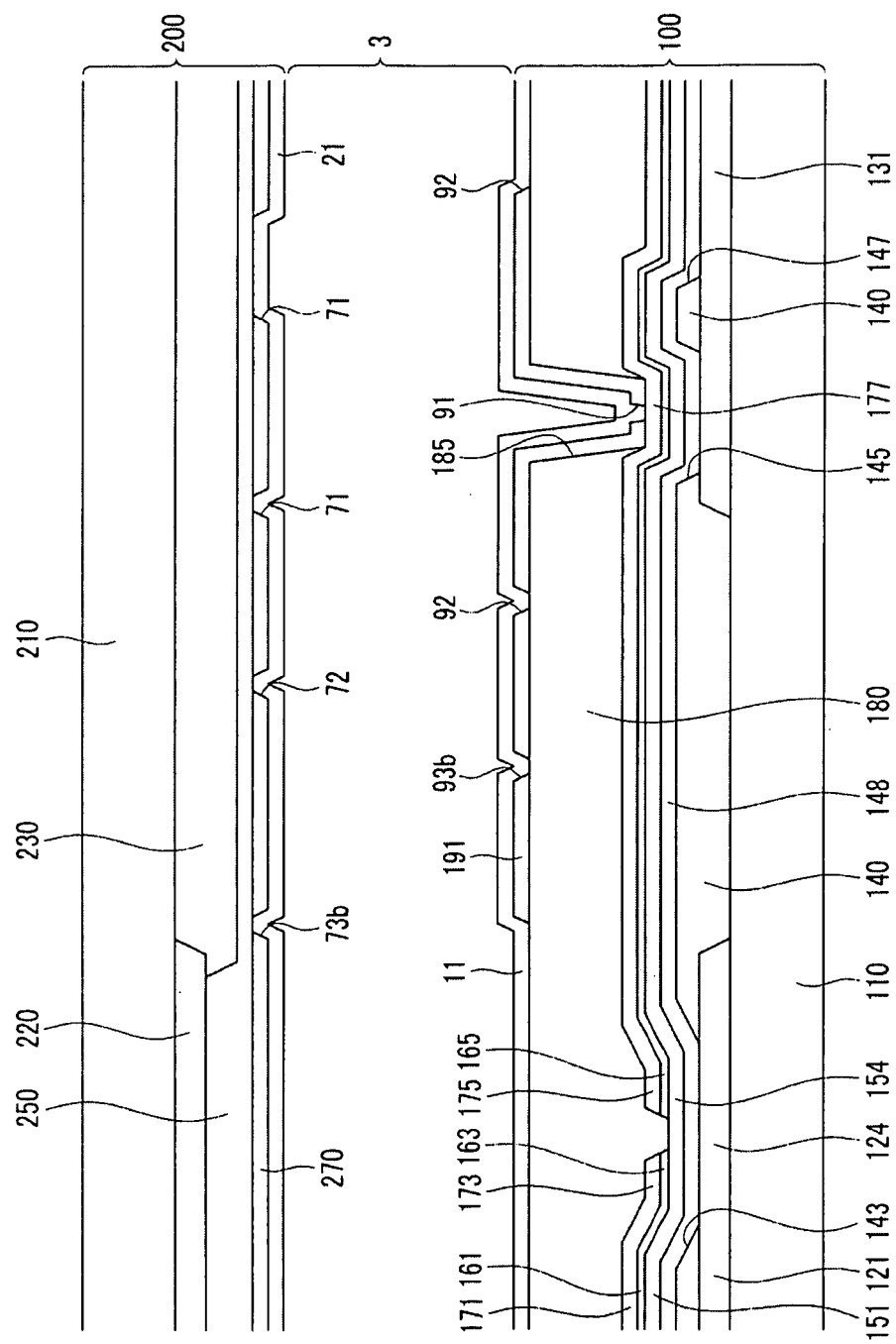
FIG. 3 is a cross-sectional view of the liquid crystal panel assembly shown in FIG. 2 taken along line III-III.
Figure 4:
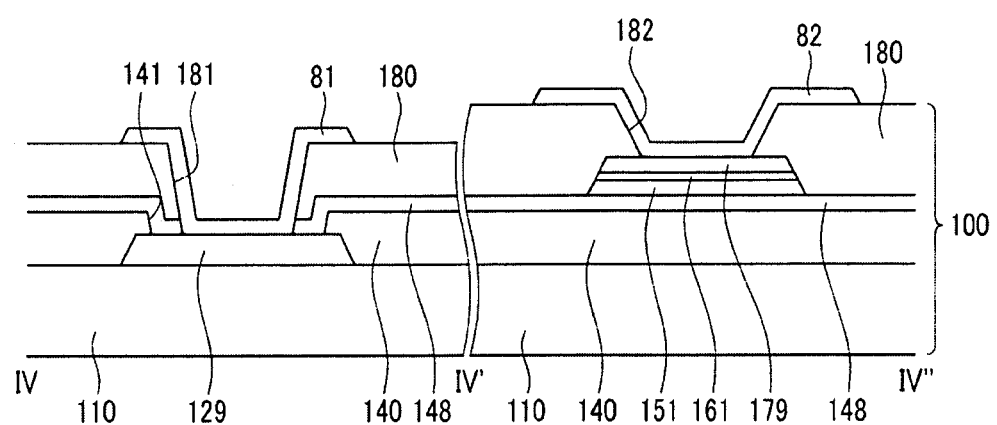
FIG. 4 is a cross-sectional view of the liquid crystal panel assembly shown in FIG. 2 taken along lines IV-IV' and IV'-IV".

FIG. 2 is a layout view of a liquid crystal panel assembly according to an exemplary embodiment of the present invention, FIG. 3 is a cross-sectional view of the liquid crystal panel assembly shown in FIG. 2 taken along line III-III, and FIG. 4 is a cross-sectional view of the liquid crystal panel assembly shown in FIG. 2 taken along lines IV-IV' and IV'-IV".

Referring to FIG. 2, FIG. 3, and FIG. 4, a liquid crystal panel assembly according to the present exemplary embodiment includes a lower panel 100 and an upper panel 200, and a liquid crystal layer 3 disposed between the two display panels 100 and 200.

First, the lower panel 100 will be described.

A plurality of gate conductors including a plurality of gate lines 121 and a plurality of storage electrode lines 131 are formed on an insulating substrate 110, which may be made of transparent glass or plastic.

The gate line 121 extends substantially in a transverse direction, transmits a gate signal, and includes a plurality of gate electrodes 124 protruding upward and an end portion 129 having a large area for connection with another layer or a gate driving circuit. The gate lines 121 may be directly connected to the gate driver (not shown), which may be directly integrated on the substrate 110.

The storage electrode lines 131 extend substantially in a transverse direction and are supplied with a voltage such as a common voltage Vcom. Each storage electrode line 131 is disposed between two neighboring gate lines 121 and is the same distance from each of the two neighboring gate lines 121.

The gate conductors 121 and 131 may be made of a metal having a low resistance such as an aluminum-containing metal such as aluminum (Al) or aluminum alloy, a silver-containing metal such as silver (Ag) or silver alloy, or a copper-containing metal such as copper (Cu) or copper alloy. They may also have a multilayer structure including two conductive layers (not shown) of different physical properties. However, the gate lines 121 and the storage electrode lines 131 may be made of other various metals or conductors.

The thickness of the gate conductors 121 and 131 may be in the range of about 0.5 μm to about 7 μm.

A low dielectric insulating layer 140 is formed on the gate conductors 121 and 131.

The low dielectric insulating layer 140 may be made of an organic insulator such as hydrogen silsesquioxane (HSQ), methylsilsesquioxane (MSQ), polyimides, polynorbornenes (PN), benzocyclobutene, aromatic polymers, vapor-deposited parylene, parylene-F, fluorine-doped amorphous carbon, or Teflon® PTFE. The low dielectric insulating layer 140 may be made of an inorganic insulator such as fluorine-doped silicon oxide ($SiO_2F$), carbon-doped silicon oxide ($SiO_2C$), hydrogen-doped silicon oxide ($SiO_2H$), porous silicon oxide (porous $SiO_2$), porous carbon silicon oxide (porous $SiO_2C$), and highly porous oxides. The low dielectric insulating layer 140 may have a dielectric constant (relative permittivity) of less than about 3.5, and the surface thereof may be planarized. When the low dielectric insulating layer 140 is made of an organic insulator, the organic insulator may have high thermal resistance.

The thickness of the low dielectric insulating layer 140 may be in the range of about 0.5 μm to about 8 μm. Also, the low dielectric insulating layer 140 may be thicker than the gate conductors 121 and 131, and the surface thereof is substantially flat. Accordingly, a big step difference in another layer on the low dielectric insulating layer 140 due to the thick gate conductors 121 and 131 may be prevented, thereby preventing a defect of an overlying metal layer such as a disconnection.

The low dielectric insulating layer 140 has openings 143 exposing the gate electrodes 124, openings 145 and 147 exposing a portion of the storage electrode lines 131, and openings 141 exposing a portion of the end portions 129 of the gate lines 121. The inclination angle formed by the side surfaces of the central portions of the left edge and the upper edge among four edges of the opening 143, with the surface of the substrate 110, is smaller than the inclination angle formed by the side surfaces of the remaining edges of the opening 143 and the side surfaces of the openings 145, 147, and 141, with the surface of the substrate 110, and is very gentle. Accordingly, an abrupt change of the height of the low dielectric insulating layer 140 is decreased, thereby preventing a defect such as the disconnection of the overlying metal layer.

A gate insulating layer 148, which may be made of silicon oxide ($SiO_x$) or silicon nitride ($SiN_x$), is formed on the low dielectric insulating layer 140.

A plurality of semiconductor stripes 151, which may be made of hydrogenated amorphous silicon (a-Si) or polysilicon, are formed on the gate insulating layer 148. Each semiconductor stripe 151 extends in a longitudinal direction, and includes a plurality of protrusions 154 extending toward the gate electrodes 124.

A plurality of ohmic contact stripes and islands 161 and 165 are formed on the semiconductor stripes 151. The ohmic contact stripes 161 include a plurality of protrusions 163, and the protrusions 163 and the ohmic contact islands 165 are opposite to each other with respect to the gate electrodes 124 and form a pair disposed on the protrusions 154 of the semiconductor stripes 151. The ohmic contacts 161 and 165 may be made of a material such as n+ hydrogenated amorphous silicon highly doped with an n-type impurity such as phosphorus or silicide.

A plurality of data conductors including a plurality of data lines 171 and a plurality of drain electrodes 175 are formed on the ohmic contacts 161 and 165.

The data lines 171 transmit data voltages and extend substantially in a longitudinal direction while crossing the gate lines 121 and the storage electrode lines 131. Each data line 171 includes a plurality of source electrodes 173 curving toward the gate electrodes 124 and having a "U" shape and an end portion 179 for connection with another layer or a data driver (not shown). When the data driver (not shown) is integrated on the substrate 110, the data lines 171 may extend to be directly connected to the data driver (not shown).

On the other hand, a portion disposed on the boundary of the opening 143 among the source electrode 173 and the drain electrode 175 may have a gentle slope according to the gentle slope of the underlying low dielectric insulating layer 140, so that a defect such as a disconnection of the source electrode 173 and the drain electrode 175 generated by a fast change in the height thereof may be prevented.

Since a metal layer such as the source electrode 173 and the drain electrode 175 is disposed on the portion having a gentle slope, light leakage may be sufficiently prevented by the metal layer.

The drain electrodes 175 are opposite the source electrodes 173 with respect to a gate electrode 124, and each drain electrode 175 includes one end portion 177 having a wide area and another end portion having a bar shape. The wide end portion 177 overlaps the storage electrode lines 131, and the bar-shaped end portion is enclosed by the curved portion of the source electrode 173.

The data conductors 171 and 175 may include a refractory metal such as molybdenum, chromium, tantalum, or titanium, or an alloy thereof, and may have a multi-film structure including a refractory metal film (not shown) and a low resistance conductive layer (not shown). Alternatively, like the gate conductors 121 and 131, the data conductors 171 and 175 may include a metal having low resistance such as an aluminum-containing metal such as aluminum (Al) or an aluminum alloy, a silver-containing metal such as silver (Ag) or a silver alloy, or a copper-containing metal such as copper (Cu) or a copper alloy.

Also, the thickness of the data conductors 171 and 175 may be in the range of about 0.5 μm to about 7 μm like the gate conductors 121 and 131, and in this case, an additional thick low dielectric insulating layer (not shown) may be further formed on the data conductors 171 and 175. However, the data conductors 171 and 175 may be made of other various metals or conductors.

The gate conductors 121 and 131 or the data conductors 171 and 175 may include low resistance metal or be sufficiently thick to sufficiently reduce the resistance.

A gate electrode 124, a source electrode 173, and a drain electrode 175 form a thin film transistor (TFT) Q along with a protrusion 154 of the semiconductor stripes 151, and the channel of the thin film transistor Q is formed in the protrusion 154 between the source electrode 173 and the drain electrode 175.

As described above, since the low dielectric insulating layer 140 has the opening 143 exposing the gate electrode 124, the low dielectric insulating layer 140 does not exist on the channel of the thin film transistor Q. Accordingly, only the gate insulating layer 148 is present between the gate electrode 124 and the protrusions 154 of the semiconductor stripes 151 so that a decrease in the on-current $I_{on}$ of the thin film transistor Q may be prevented.

The semiconductor stripe 151, except for the protrusion 154, which is included in the thin film transistor, may have the same planar shape as the data conductors 171 and 175, and the ohmic contact layers 161 and 165. Particularly, the ohmic contacts 161 and 165 may have substantially the same planar shape as the data lines 171 and the drain electrodes 175. However the semiconductor stripes 151 include exposed portions that are not covered by the ohmic contact layers 161 and 165, the data lines 171, and the drain electrodes 175 such as the portions between the source electrodes 173 and the drain electrodes 175.

A passivation layer 180 is formed on the data conductors 171 and 175 and the exposed semiconductor islands 154. The passivation layer 180 may be made of an inorganic insulator or an organic insulator, and may have a flat surface. The organic insulator may have a dielectric constant of less than about 4.0 and may be photosensitive.

The passivation layer 180 has a plurality of contact holes 182 and 185 respectively exposing the end portions 179 of the data lines 171 and the wide end portions 177 of the drain electrodes 175, and the passivation layer 180 and the gate insulating layer 148 have a plurality of contact holes 181 exposing the end portions 129 of the gate lines 121.

A plurality of pixel electrodes 191 and a plurality of contact assistants 81 and 82 are formed on the passivation layer 180. They may be made of a transparent conductive material such as indium tin oxide (ITO) or indium zinc oxide (IZO), or a reflective metal such as aluminum, silver, chromium, or an alloy thereof.

Each pixel electrode 191 has an approximately quadrangle shape having four main edges nearly parallel to the gate lines 121 or the data lines 171a and 171b, as well as four chamfered corners. The chamfered edges of the pixel electrodes 191 make an angle of about 45 degrees with the gate lines 121.

Each pixel electrode 191 includes a first central cutout 91, a second central cutout 92, a first upper cutout 93a, a first lower cutout 93b, a second upper cutout 94a, and a second lower cutout 94b, and is divided into a plurality of partitions by the cutouts 91, 92, 93a, 93b, 94a, and 94b. The cutouts 91, 92, 93a, 93b, 94a, and 94b are substantially inversely symmetrical with respect to a virtual horizontal central line that bisects the pixel electrode 191.

The first and second upper cutouts 93a and 94a, the first and second lower cutouts 93b and 94b, oblique edges of the first central cutout 91, and oblique portions of the second central cutout 92 are substantially parallel to each other, and may form angles of about 45 degrees with the gate lines 121.

The pixel electrodes 191 are connected to the drain electrodes 175 through the contact holes 185, and are applied with data voltages from the drain electrodes 175.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179, and complement the adhesion of the end portions 129 and 179 to external devices.

Next, the upper panel 200 will be described in detail.

A light blocking member 220 is formed on an insulating substrate 210, which may be made of a material such as transparent glass or plastic. The light blocking member 220 prevents light leakage between the pixel electrodes 191 and defines a plurality of openings facing the pixel electrodes 191.

A plurality of color filters 230 are formed on the substrate 210 and the light blocking member 220. The color filters 230 are disposed mostly in the areas enclosed by the light blocking member 220, and may extend substantially along a row of the pixel electrodes 191. Each color filter 230 may represent one of the primary colors, such as red, green, and blue.

Unlike the present exemplary embodiment, the light blocking member 220 and the color filters 230 may be disposed on the lower panel 100.

An overcoat 250 is formed on the color filters 230 and the light blocking member 220. The overcoat 250 may be made of an (organic) insulating material, and prevents the color filters 230 from being exposed and provides a flat surface. The overcoat 250 may be omitted.

A common electrode 270 is formed on the overcoat 250. The common electrode 270 may be made of a transparent conductive material, such as ITO and IZO, and receives the common voltage Vcom.

The common electrode 270 has a plurality of sets of cutouts 71, 72, 73a, 73b, 74a, and 74b. The cutouts 71, 72, 73a, 73b, 74a, and 74b include first and second central cutouts 71 and 72, first and second upper cutouts 73a and 74a, and first and second lower cutouts 73b and 74b. The cutouts 71, 72, 73a, 73b, 74a, and 74b also substantially have inverse symmetry with respect to the above-described virtual horizontal central line bisecting the pixel electrode 191. Each of the cutouts 71, 72, 73a, 73b, 74a, and 74b has at least one oblique portion extending substantially obliquely, and each oblique portion has a plurality of notches that are concave or convex.

At least one of the cutouts 91, 92, 93a, 93b, 94a, 94b, 71, 72, 73a, 73b, 74a, and 74b of the pixel electrodes 191 and the common electrode 270 may be replaced with protrusions or depressions, and the shape and the arrangement thereof may be changed.

Alignment layers 11 and 21 may be provided on inner surfaces of the display panels 100 and 200, and they may be homeotropic alignment layers.

Polarizers (not shown) may be provided on the outer surface of the display panels 100 and 200, and the transmissive axes of two polarizers (not shown) may be crossed and one transmissive axis thereof may be parallel to the gate lines 121.

The liquid crystal layer 3 between the lower panel 100 and the upper panel 200 may have negative dielectric anisotropy and includes liquid crystal molecules that may be oriented so that their major axes are almost perpendicular to the surfaces of the two display panels 100 and 200 when no electric field is applied.

A pixel electrode 191 and the common electrode 270 form a liquid crystal capacitor Clc along with the liquid crystal layer 3 therebetween to maintain an applied voltage after the thin film transistor Q is turned off.

The wide end portion 177 of the drain electrode 175 connected to the pixel electrode 191 overlaps the storage electrode line 133 via the gate insulating layer 148, the protrusion 154, and the ohmic contact 165 to form a storage capacitor Cst to enhance the voltage maintaining capacity of the liquid crystal capacitor Clc. The opening 147 where the low dielectric insulating layer 140 is removed is disposed on the portion where the wide end portion 177 of the drain electrode and the storage electrode line 131 overlap each other so that the capacitance of the storage capacitor Cst may be increased, thereby enhancing the voltage storing capacity.

The pixel electrodes 191, to which data voltages are applied, generate an electric field together with the common electrode 270 of the upper panel 200 that receives the common voltage Vcom, to thereby determine tilt directions of liquid crystal molecules of the liquid crystal layer 3 disposed between the two electrodes 191 and 270. Such an electric field includes a vertical component substantially perpendicular to the surfaces of the display panels 100 and 200, and a horizontal component substantially parallel to the surfaces of the display panels 100 and 200 and substantially perpendicular to the cutouts 91, 92, 93a, 93b, 94a, 94b, 71, 72, 73a, 73b, 74a, and 74b. The tilt direction of the liquid crystal molecules is primarily determined depending on the horizontal component, and the tilt directions of the liquid crystal molecules are basically classified into four directions. In this way, the tilt directions of the liquid crystal molecules are diversified such that the reference viewing angle of the liquid crystal display may be increased.

Also, as described above, the metal conductors 121, 131, 171, and 175 may be made of low resistance metals and have a thickness sufficient to reduce the wire resistance, and the low dielectric insulating layer 140 may be made of an insulating material having a low dielectric constant, so that a signal delay due to an RC delay may be reduced upon driving the liquid crystal display and the charging time of the pixel voltages may be sufficiently guaranteed. Particularly, it may be advantageous for a large liquid crystal display with high resolution, and for preventing non-uniformity of the display when driving the liquid crystal display.

Next, a method of manufacturing the lower panel 100 of the liquid crystal panel assembly according to an exemplary embodiment of the present invention shown in FIG. 1, FIG. 2, FIG. 3, and FIG. 4 will be described in detail with reference to FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, and FIG. 11B as well as to FIG. 1, FIG. 2, FIG. 3, and FIG. 4.

FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, and FIG. 11B are cross-sectional views sequentially showing intermediate steps of a method of manufacturing a lower panel of the liquid crystal panel assembly shown in FIG. 1, FIG. 2, FIG. 3, and FIG. 4 according to an exemplary embodiment of the present invention, taken along lines III-III and IV-IV'-IV" in FIG. 2.

Figure 5A:
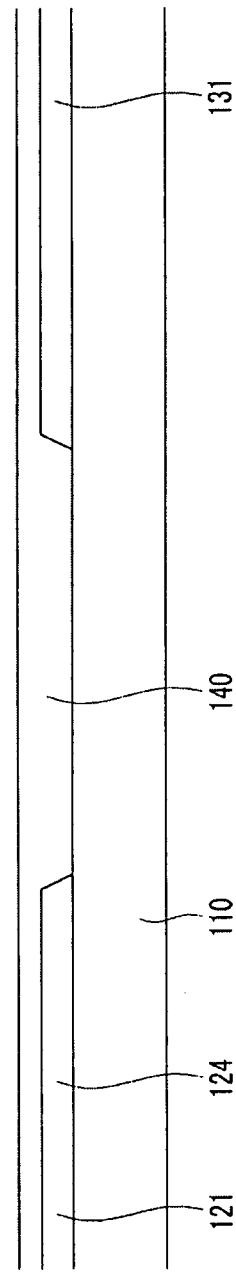
FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, and FIG. 11B are cross-sectional views sequentially showing intermediate steps of a method of manufacturing a lower panel of the liquid crystal panel assembly shown in FIG. 1, FIG. 2, FIG. 3, and FIG. 4 according to an exemplary embodiment of the present invention, taken along lines III-III and IV-IV'-IV" in FIG. 2.
Figure 5B:
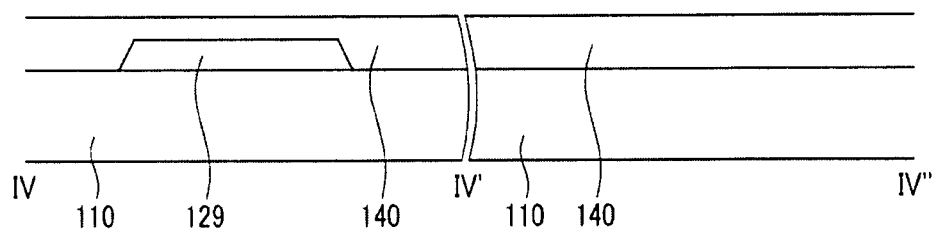

Referring to FIG. 5A and FIG. 5B, a gate conductive layer (not shown), which may be made of a metal having low resistance such as an aluminum-containing metal, a silver-containing metal, or a copper-containing metal, is deposited on an insulating substrate 110 made of a material such as transparent glass, and patterned by photolithography to form gate conductors 121 and 131 including a plurality of gate lines 121 including gate electrodes 124 and a plurality of storage electrode lines 131. The deposition of the gate conductive layer (not shown) may be performed by sputtering, electroplating, electroless plating, inkjet printing, or gravure printing. The thickness of the gate conductor 121 and 131 may be in the range of about 0.5 μm to about 7 μm. Here, a lower buffer layer, which may be made of silicon nitride $SiN_x$, may be attached on the substrate 110 to prevent bending of the substrate 110 due to stress generated when depositing the gate conductive layer (not shown).

Next, a low dielectric insulating layer 140, which may include a photosensitive organic insulator such as hydrogen silsesquioxane (HSQ), methylsilsesquioxane (MSQ), polyimide, polynorbornenes (PN), benzocyclobutene, aromatic polymers, vapor-deposited parylene, parylene-F, fluorine-doped amorphous carbon, or Teflon® PTFE, is deposited on the gate conductors 121 and 131. When the deposited low dielectric insulating layer 140 is not flat, the surface thereof may be polished to be planarized.

Figure 6A:
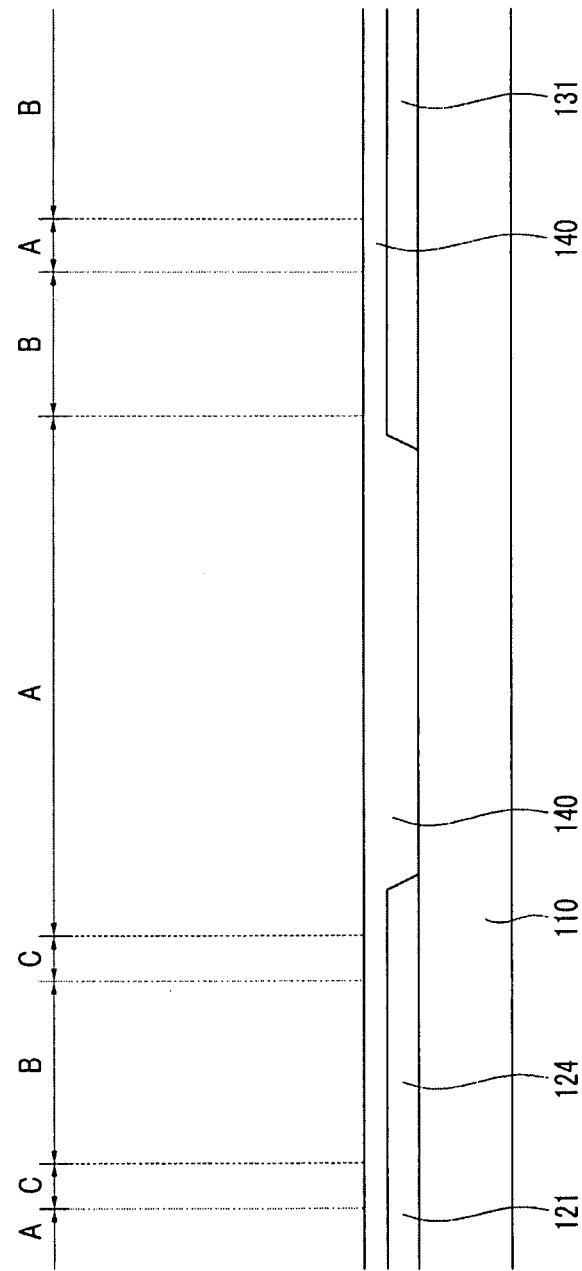
Figure 6B:
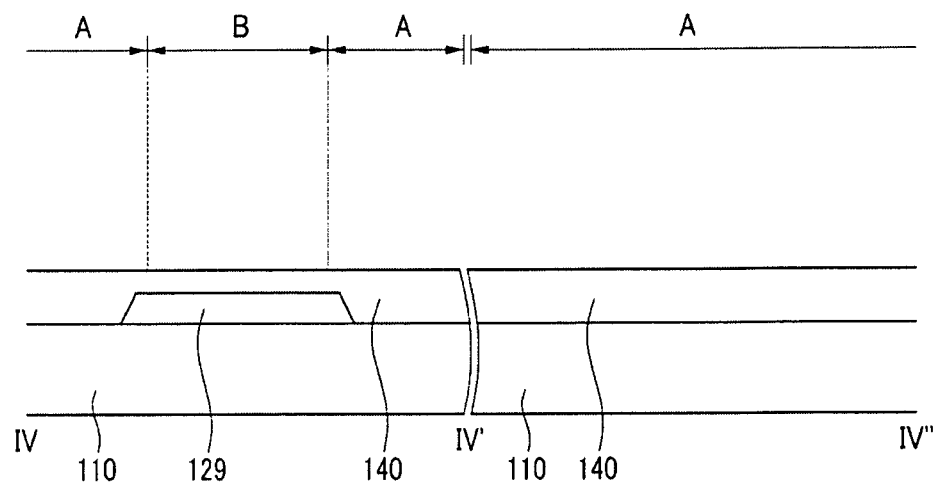
Figure 6C:
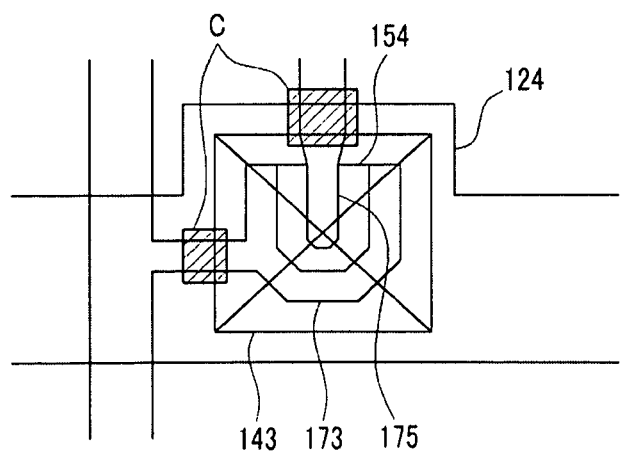
FIG. 6C is a layout view of a portion of the liquid crystal panel assembly shown in FIG. 2.
Figure 7A:
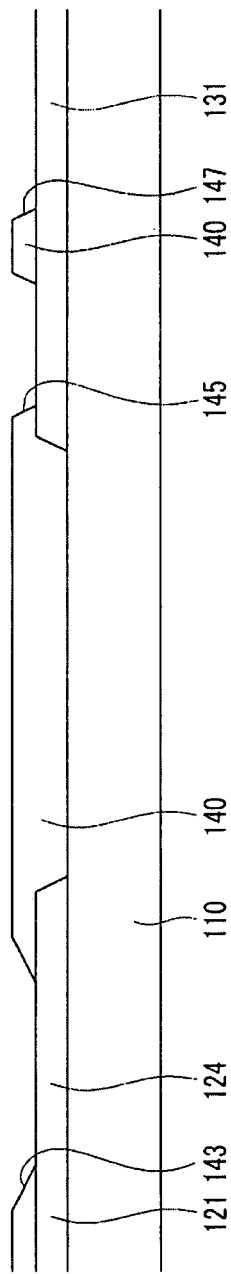
Figure 7B:
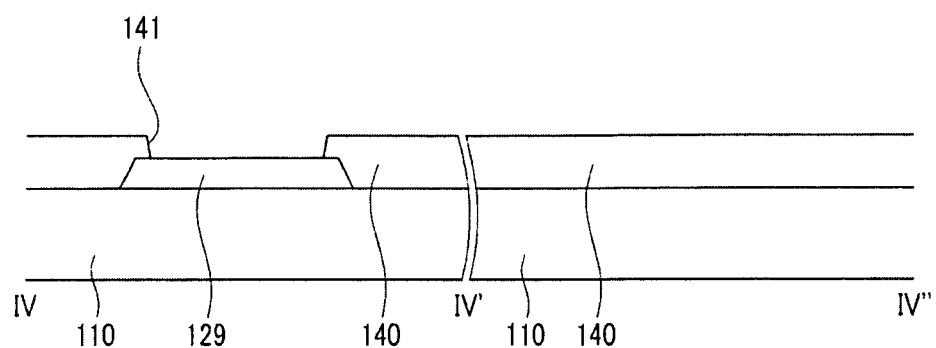

Next, referring to FIG. 6A, FIG. 6B, and FIG. 6C, the low dielectric insulating layer 140 may be irradiated by light through a mask (not shown) to form openings 141, 143, 145, and 147, as shown in FIG. 7A and FIG. 7B.

Here, when the organic insulator has negative photosensitivity such that a portion that is not irradiated by light is removed, a portion of the mask (not shown) located in region A is transparent such that light is irradiated on the low dielectric insulating layer 140, a portion of the mask located in region B is opaque such that light is not irradiated on the low dielectric insulating layer 140, and a portion of the mask located in region C is translucent such that light is partially irradiated onto the low dielectric insulating layer 140. The mask (not shown) on region C may include a pattern such as a slit or a lattice, or may be a translucent layer to control the transmittance of light. Referring to FIG. 6C, region C is positioned on a portion where a source electrode 173 and a drain electrode 175, which will be formed later, overlaps the boundary of the opening 143 of the low dielectric insulating layer 140.

When light is irradiated through the mask (not shown) and the low dielectric insulating layer 140 is developed, the low dielectric insulating layer 140 in region A remains, the low dielectric insulating layer 140 in region B is removed, and the low dielectric insulating layer 140 in region C forms a gentle slope with a smooth inclination angle with respect to the substrate 110 between region A and region B, as shown in FIG. 7A.

When the low dielectric insulating layer 140 has positive photosensitivity, the transmittances of regions A and B of the light mask (not shown) are exchanged, and region C is translucent.

Figure 8A:
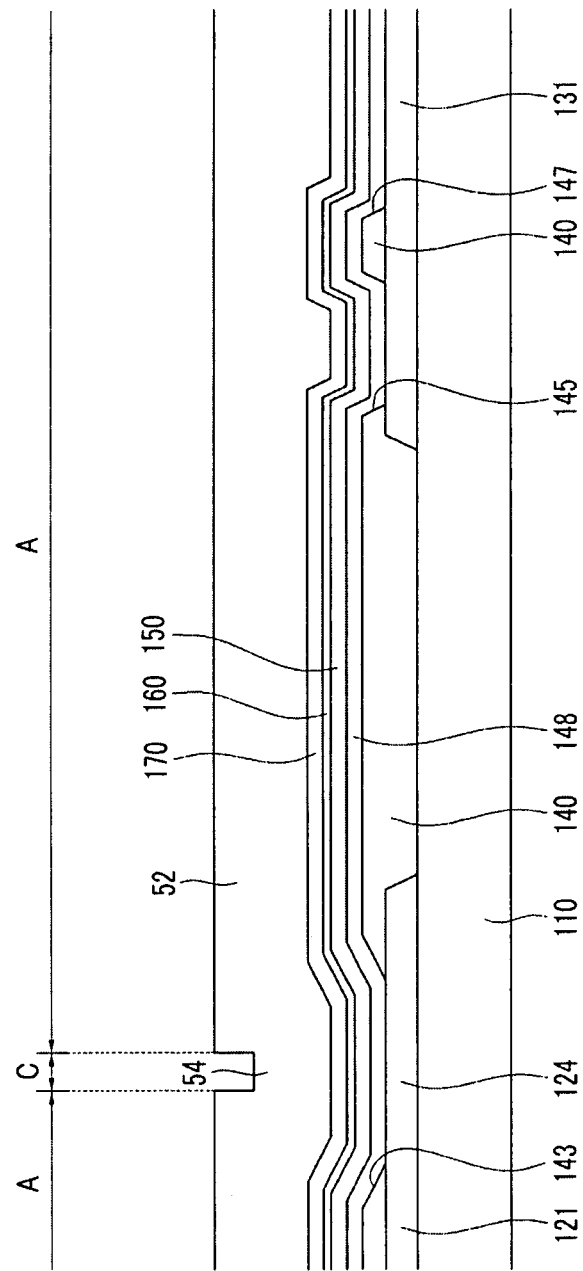
Figure 8B:
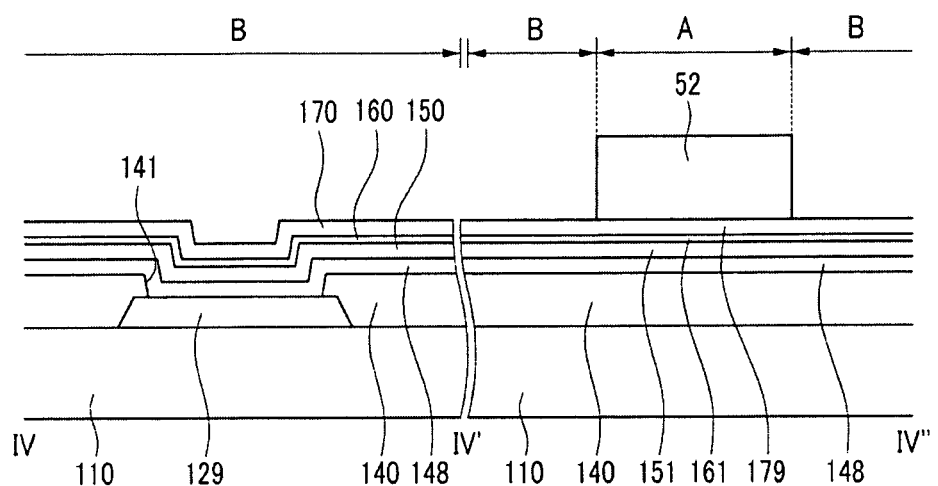

Referring to FIG. 8A and FIG. 8B, a gate insulating layer 148, a semiconductor layer 150, and an impurity-doped semiconductor layer 160 are sequentially deposited by a method, such as a chemical vapor deposition method, on the gate conductors 121 and 131 and the low dielectric insulating layer 140. Next, a data conductive layer 170 is deposited by a method such as sputtering, and a negative photosensitive film is coated thereon. Next, the photosensitive film is exposed by light through the mask (not shown) and developed to form a photosensitive film pattern 52 and 54.

Here, a portion of the mask (not shown) in region A is transparent such that light is irradiated therethrough, a portion of the mask (not shown) in region B is opaque such that light is not irradiated therethrough, and a portion of the mask (not shown) in region C is translucent such that light is partially irradiated therethrough. The portion of the photosensitive film irradiated by light remains, and the portion of the photosensitive film not irradiated by light is removed, so that the photosensitive film disposed in region A becomes the thick photosensitive film pattern 52, the photosensitive film disposed in region B is removed, and the photosensitive film disposed in region C becomes the photosensitive film pattern 54 which is thinner than the photosensitive film pattern 52. The portion of the mask (not shown) in region C may include a pattern, such as a slit or a lattice, or may be a translucent layer.

Figure 9A:
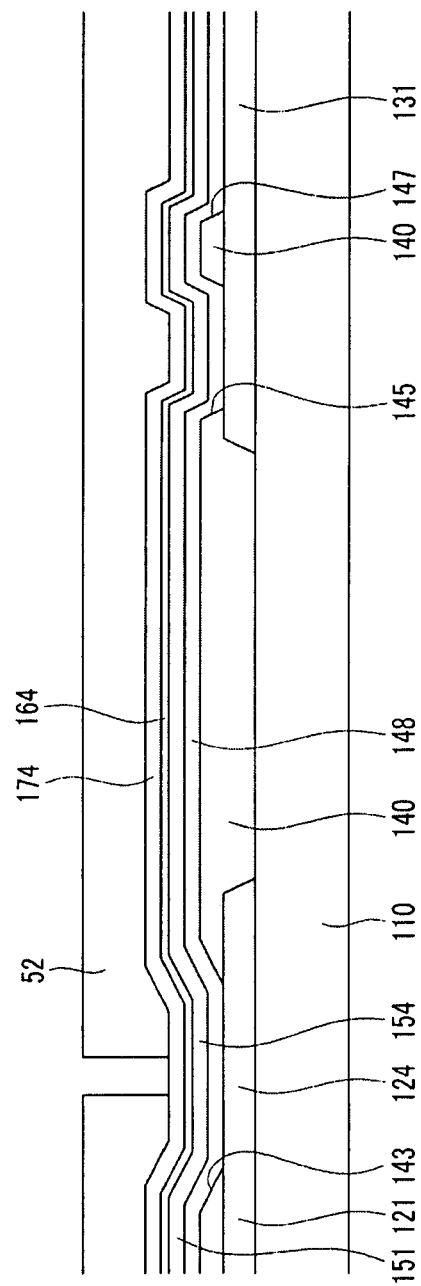
Figure 9B:
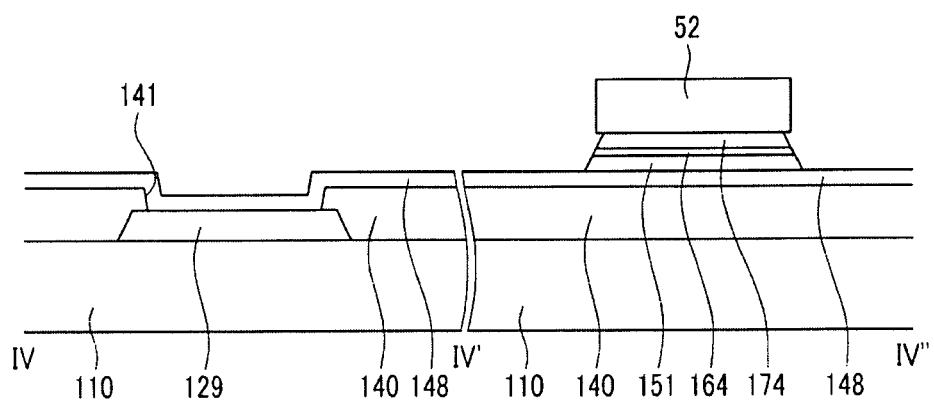

Next, referring to FIG. 9A and FIG. 9B, the data conductive layer 170, the impurity-doped semiconductor layer 160, and the semiconductor layer 150 that are disposed in region B are etched to form a plurality of data conductor layers 174, a plurality of ohmic contact layers 164, and a plurality of semiconductor stripes 151, which may have the same planar shape. Next, the photosensitive film pattern 54 disposed in region C is removed.

Figure 10A:
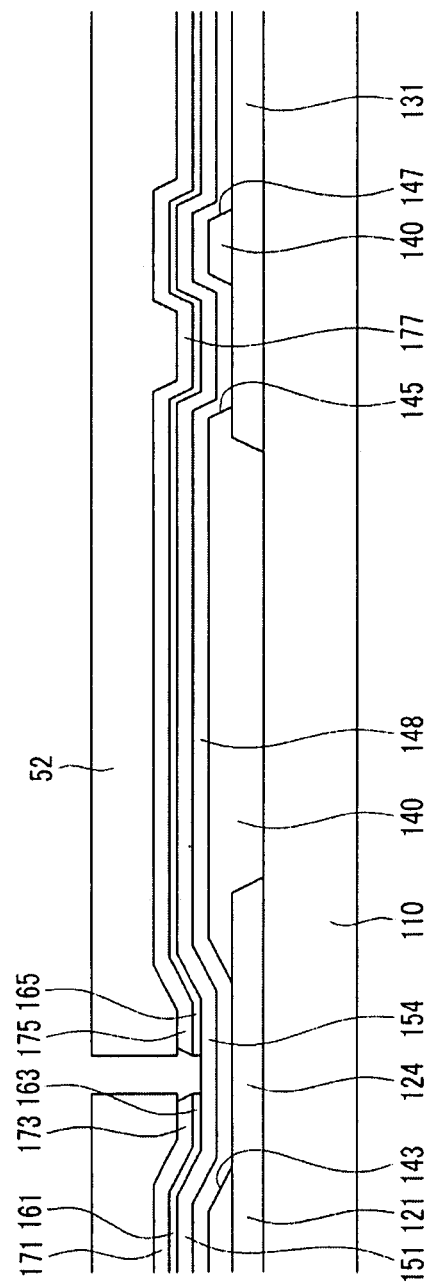
Figure 10B:
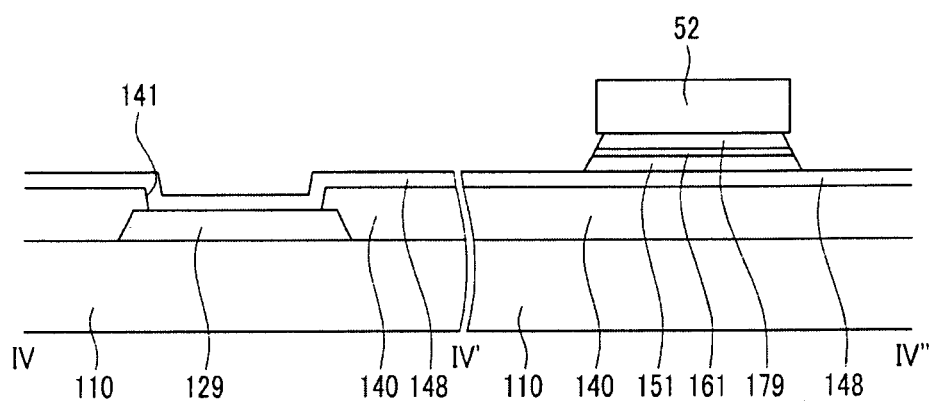

Next, as shown in FIG. 10A and FIG. 10B, the data conductor layers 174 and the ohmic contact layers 164 are etched using the remaining photosensitive film pattern 52 as an etching mask to expose the channel region of the protrusion 154 of the semiconductor stripes 151 and to form a plurality of data lines 171 including source electrodes 173, a plurality of drain electrodes 175, a plurality of ohmic contact stripes 161 including protrusions 163, and a plurality of ohmic contact islands 165. Next, the remaining photosensitive film 52 is removed.

Unlike the present exemplary embodiment, when the photosensitive film 52 and 54 has positive photosensitivity, the transmittances of the mask (not shown) in regions A and B may be reversed and the translucency in region C may be maintained.

Figure 11A:
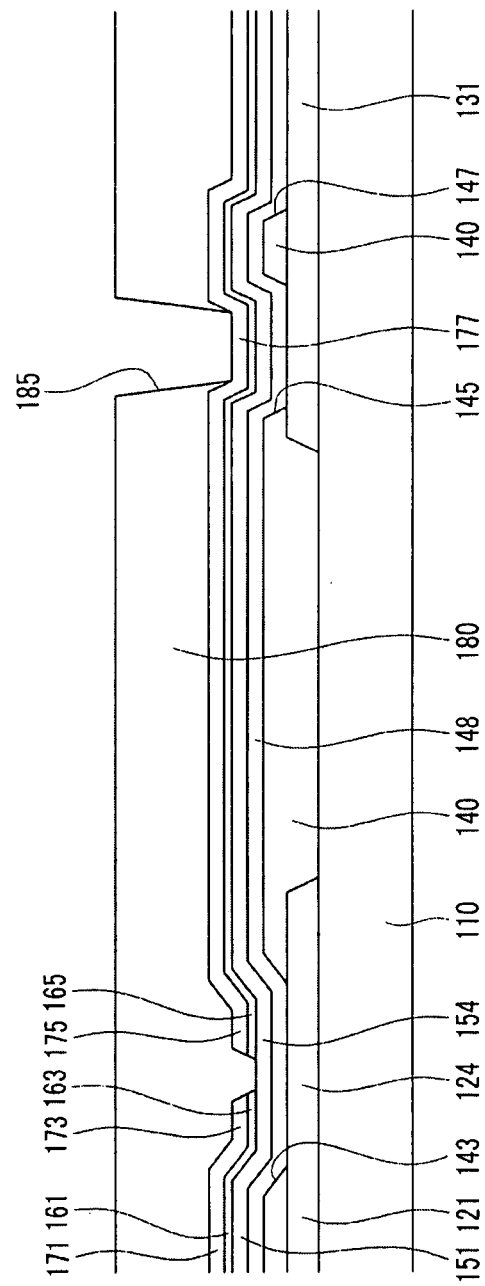
Figure 11B:
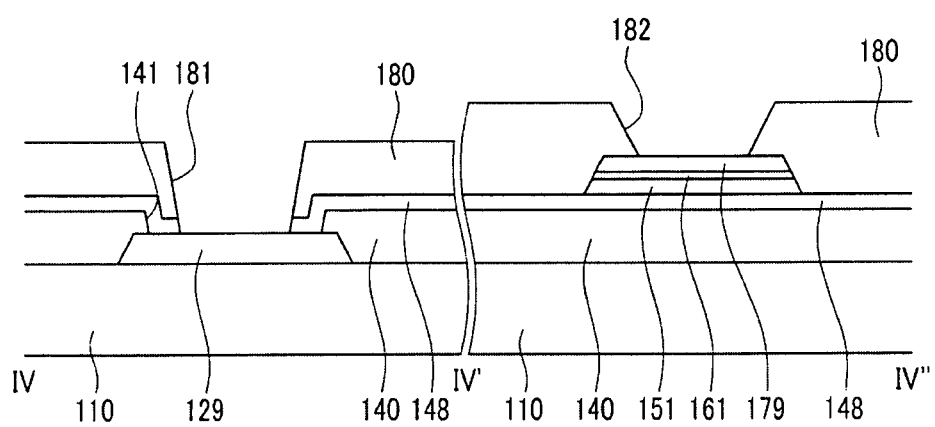

Referring to FIG. 11A and FIG. 11B, an organic insulating material or an inorganic insulating material is deposited or coated to form a passivation layer 180, and the passivation layer 180 is patterned to form a plurality of contact holes 181, 182, and 185. Here, the gate insulating layer 148 is also etched to form a plurality of contact holes 181 exposing the end portions 129 of the gate lines 121.

Finally, as shown in FIG. 2, FIG. 3, and FIG. 4, an IZO layer or an ITO layer is deposited on the passivation layer 180 by sputtering and patterned to form a plurality of pixel electrodes 191 including cutouts 91, 92, 93a, 93b, 94a, and 94b.

In the present exemplary embodiment, the data lines 171, the drain electrodes 175, the ohmic contacts 161 and 165, and the semiconductor stripes 151 are formed using one photosensitive film pattern as the etching mask, which may simplify the manufacturing process. Also, the low dielectric insulating layer 140, which has good planarization characteristics, is formed directly on the gate conductors 121 and 131 such that an additional planarization layer, which compensates the step difference due to the thick gate conductors 121 and 131, is not needed, which may further simplify the manufacturing process while a signal delay my be prevented.

Next, a liquid crystal panel assembly according to another exemplary embodiment of the present invention will be described in detail with reference to FIG. 12, FIG. 13, FIG. 14, and FIG. 15.

Figure 12:
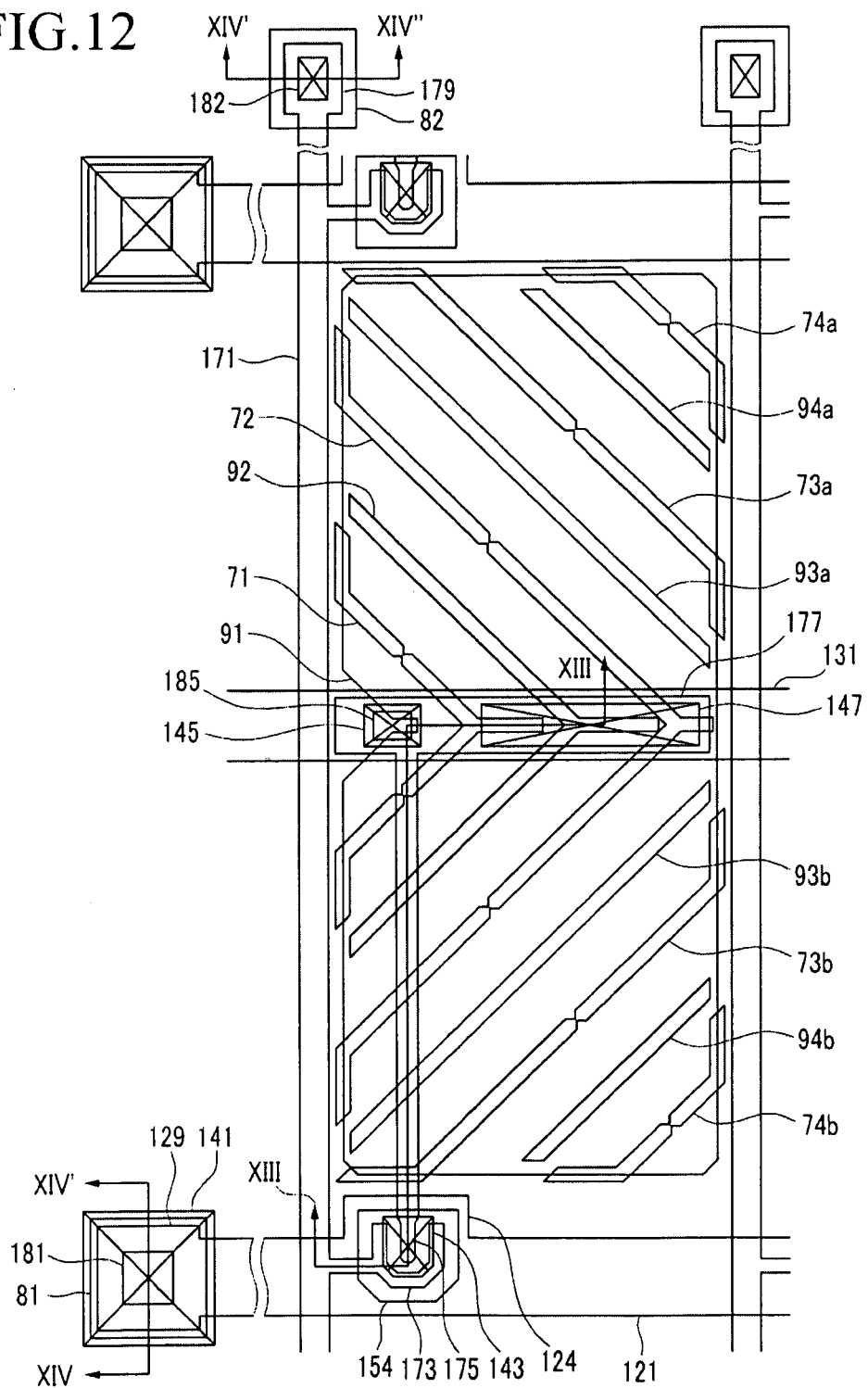
FIG. 12 is a layout view of a liquid crystal panel assembly according to an exemplary embodiment of the present invention.
Figure 13:
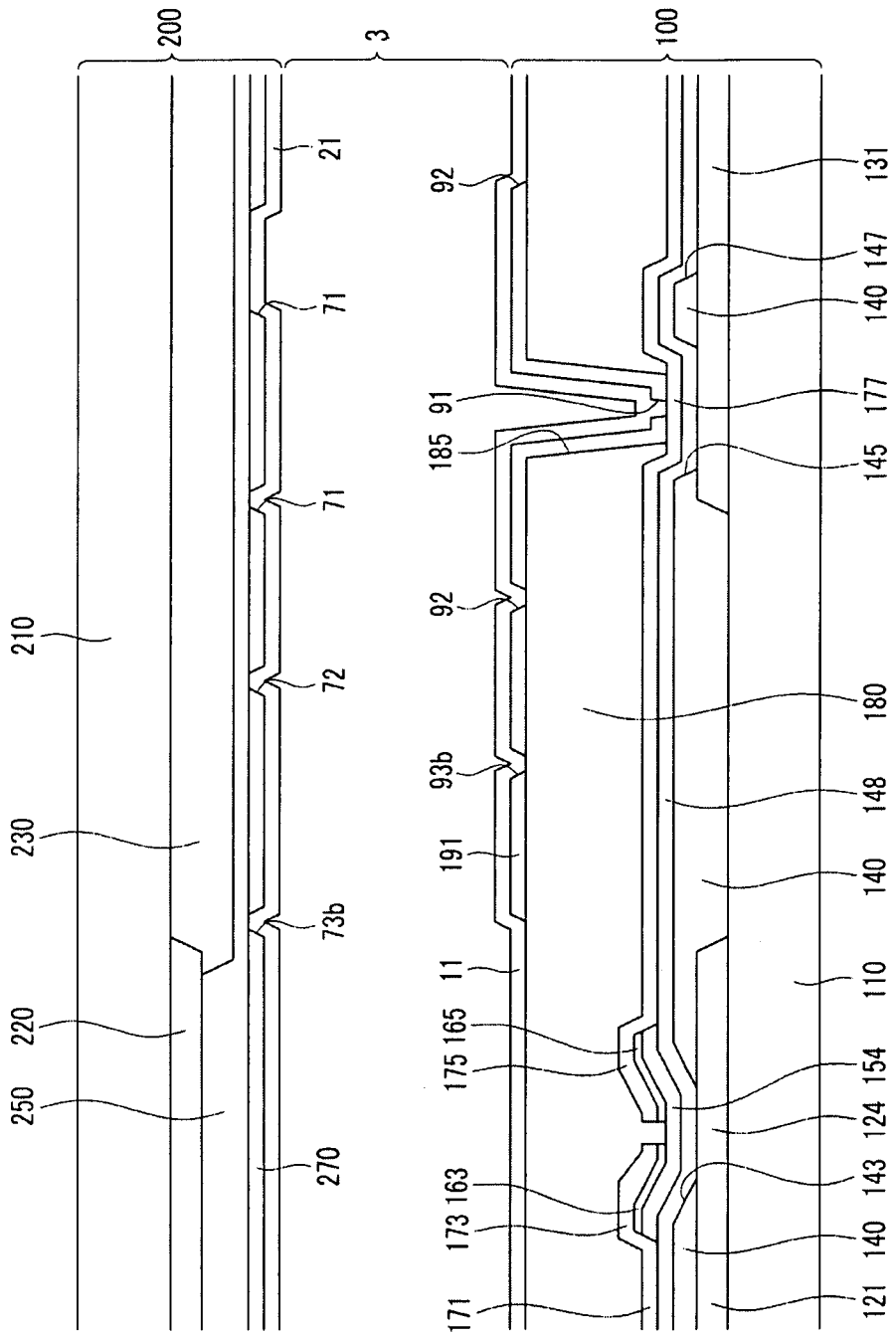
FIG. 13 is a cross-sectional view of the liquid crystal panel assembly shown in FIG. 12 taken along line XIII-XIII.
Figure 14:
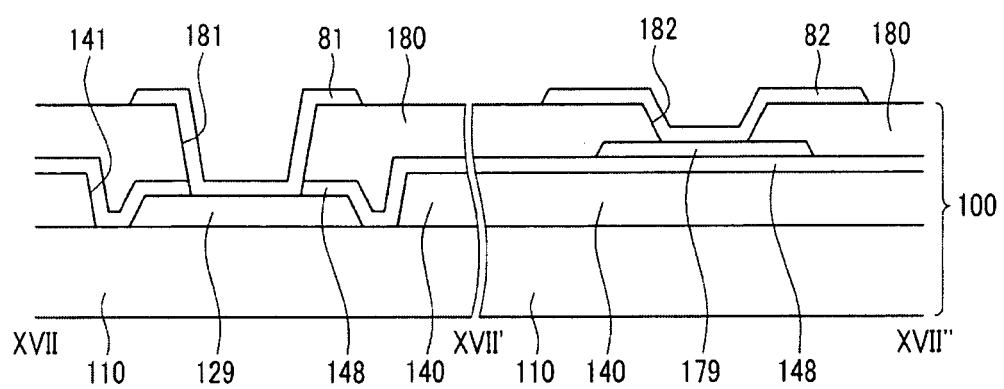
FIG. 14 is a cross-sectional view of the liquid crystal panel assembly shown in FIG. 12 taken along lines IV-IV' and XIV'-XIV".
Figure 15:
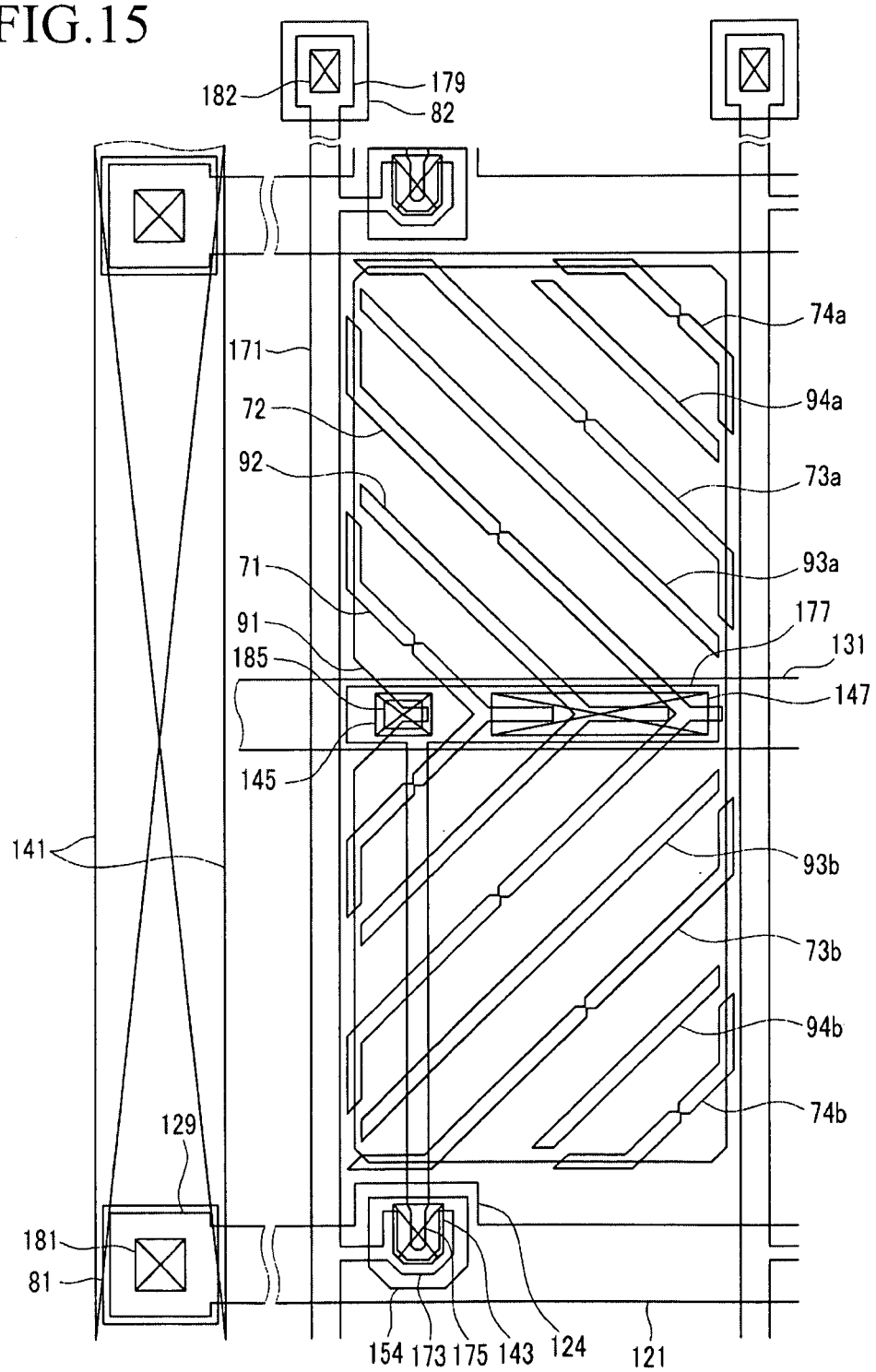
FIG. 15 is a layout view of a liquid crystal panel assembly according to another exemplary embodiment of the present invention.

FIG. 12 is a layout view of a liquid crystal panel assembly according to an exemplary embodiment of the present invention, FIG. 13 is a cross-sectional view of the liquid crystal panel assembly shown in FIG. 12 taken along line XIII-XIII, FIG. 14 is a cross-sectional view of the liquid crystal panel assembly shown in FIG. 12 taken along lines IV-IV' and XIV'-XIV", and FIG. 15 is a layout view of a liquid crystal panel assembly according to another exemplary embodiment of the present invention.

A liquid crystal panel assembly according to the present exemplary embodiment of the present invention includes a lower panel 100 and an upper panel 200 facing each other, and a liquid crystal layer 3 disposed therebetween.

A layered structure and a plane structure of a liquid crystal panel assembly according to the present exemplary embodiment is almost the same as the layered structure and the plane structure of the liquid crystal panel assembly shown in FIG. 2, FIG. 3, and FIG. 4. Hereafter, different characteristics from the previous exemplary embodiment will be described.

A low dielectric insulating layer 140 disposed on gate conductors 121 and 131 has openings 143 exposing portions of a gate electrodes 124, openings 145 and 147 exposing portions of a storage electrode lines 131, and openings 141 exposing end portions of the gate lines 121.

Unlike the previous exemplary embodiment, the opening 143 is limited at the channel region of the thin film transistor Q. The low dielectric insulating layer 140 is only removed at the channel region of the thin film transistor Q so that the gate insulating layer 148 is only present between the gate electrode 124 and the semiconductor island 154 at the channel region, and thereby decreasing of the on-current $I_{on}$ of the thin film transistor Q may be prevented. Also, in the present exemplary embodiment, the slope of side surfaces of the opening 143 may be gentle so that a defect, such as disconnection due to a high step difference of an overlying metal layer such as the source electrode 173 and the drain electrode 175, may be prevented.

The opening 141 exposes the whole end portion 129 of the gate lines 121, unlike the previous exemplary embodiment. Accordingly, defective adhesion of the end portion 129 with an external device due to a high step difference of the low dielectric insulating layer 140 at the end portion 129 may be prevented.

Alternatively, as shown in FIG. 15, the low dielectric insulating layer 140 may be removed along the end portions 129 of the gate lines 121 in a longitudinal direction, thereby forming a long opening 141 that exposes all of the end portions 129 of the gate lines 121.

A plurality of semiconductor islands 154 are formed on the gate insulating layer 148, and a plurality of pairs of ohmic contact islands 163 and 165 are formed thereon. Unlike the previous exemplary embodiment, in the present exemplary embodiment, the ohmic contacts 163 and 165 are disposed only between the underlying semiconductor islands 154 and the overlying data conductors 171 and 175 and reduce contact resistance therebetween. The semiconductor islands 154 include exposed portions not covered by the data conductors 171 and 175 such as the portion between the source electrodes 173 and the drain electrodes 175.

According to the exemplary embodiments of the present invention, a signal delay of the display device may be prevented so that display characteristics may be improved, and simultaneously, the manufacturing process of the display device may be simplified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a substrate;
   a first conductor disposed on the substrate;
   a first insulating layer disposed on the first conductor;
   a second insulating layer disposed on the first insulating layer;
   a semiconductor disposed on the second insulating layer; and
   a second conductor disposed on the semiconductor,
   wherein a thickness of the first insulating layer is greater than a thickness of the first conductor,
   wherein the first conductor, the second insulating layer, the semiconductor, and the second conductor form a thin film transistor,
   wherein the first insulating layer comprises a first opening exposing a top surface of the first conductor, the top surface of the first conductor being substantially parallel to a surface of the substrate, the first opening facing a channel region of the thin film transistor, and wherein the second insulating layer and the semiconductor are disposed, at least in part, in the first opening, and the second insulating layer directly contacts the top surface of the first conductor in the first opening, wherein the first insulating layer completely covers lateral side surfaces of the first conductor, wherein a first portion of the first insulating layer disposed directly on the first conductor has a first thickness, a second portion of the first insulating layer not disposed directly on the first conductor has a second thickness, and the second thickness is greater than the first thickness.

2. The display device of claim 1, wherein a thickness of the first conductor is in a range of 0.5 μm to 7 μm, and a thickness of the first insulating layer is greater than 0.5 μm and less than or equal to 8 μm.

3. The display device of claim 1, wherein at least one of the first conductor and the second conductor comprises aluminum (Al), silver (Ag), or copper (Cu).

4. The display device of claim 1, wherein a dielectric constant of the first insulating layer is less than 3.5.

5. The display device of claim 4, wherein the first insulating layer comprises either an inorganic insulator or an organic insulator.

6. The display device of claim 5, wherein the inorganic insulator comprises fluorine-doped silicon oxide ($SiO_2F$), carbon-doped silicon oxide ($SiO_2C$), hydrogen-doped silicon oxide ($SiO_2H$), porous silicon oxide (porous $SiO_2$), porous carbon silicon oxide (porous $SiO_2C$), or highly porous oxides.

7. The display device of claim 5, wherein the organic insulator comprises hydrogen silsesquioxane (HSQ), methylsilsesquioxane, polyimide, polynorbornenes, benzocyclobutene, aromatic polymers, vapor-deposited parylene, parylene-F, fluorine-doped amorphous carbon, or Teflon® PTFE.

8. The display device of claim 1, wherein the first insulating layer comprises a flat surface.

9. The display device of claim 1, wherein a first inclination angle is less than a second inclination angle, the first inclination angle is an angle formed by a portion of a side surface of the first opening that is disposed under the second conductor with respect to a surface of the substrate, and the second inclination angle is an angle formed by a portion of the side surface of the first opening that is not disposed under the second conductor with respect to the surface of the substrate.

10. The display device of claim 1, wherein the first conductor comprises a plurality of gate lines, each gate line comprising one or more gate electrodes and an end portion, and wherein the first conductor further comprises a plurality of storage electrode lines, wherein the first opening comprises a second opening exposing at least a portion of the gate electrode, and wherein the first insulating layer further comprises:

a third opening exposing at least a portion of the end portion of the gate line, and a fourth opening exposing a portion of the storage electrode line.

11. The display device of claim 10, wherein a single third opening exposes the end portions of all of the gate lines.

12. The display device of claim 1, wherein the first insulating layer is configured to planarize the substrate comprising the first conductor.

13. The display device of claim 1, wherein the first insulating layer and the first conductor are both disposed directly on the substrate.

* * * * *